US011216034B2

(12) United States Patent
Park

(10) Patent No.: US 11,216,034 B2
(45) Date of Patent: Jan. 4, 2022

(54) DISPLAY DEVICE HAVING IMPROVED IMPACT RESISTANCE AND ELECTRONIC DEVICE HAVING THE SAME

(71) Applicant: SAMSUNG DISPLAY CO., LTD., Yongin-si (KR)

(72) Inventor: JaeChun Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/585,574

(22) Filed: Sep. 27, 2019

(65) Prior Publication Data

US 2020/0163231 A1 May 21, 2020

(30) Foreign Application Priority Data

Nov. 16, 2018 (KR) .................. 10-2018-0141682

(51) Int. Cl.
*G06F 1/16* (2006.01)
*H04M 1/02* (2006.01)
*G09F 9/30* (2006.01)

(52) U.S. Cl.
CPC ........ *G06F 1/1652* (2013.01); *H04M 1/0268* (2013.01); *G09F 9/301* (2013.01)

(58) Field of Classification Search
CPC ................ G06F 1/1652; G06F 1/1641; H01L 2251/5338; H01L 51/5253; H01L 51/524; H04M 1/0268; G09F 9/301; H05K 5/0017; H05K 5/03; H05K 1/147; H05K 2201/10128
See application file for complete search history.

(56) References Cited

U.S. PATENT DOCUMENTS

| 9,204,565 | B1 | 12/2015 | Lee et al. |
| 9,954,985 | B2 | 4/2018 | Xu |
| 10,090,478 | B2 | 10/2018 | Ahn et al. |
| 10,136,523 | B2 | 11/2018 | Lee |
| 10,230,063 | B2 | 3/2019 | Jang et al. |

(Continued)

FOREIGN PATENT DOCUMENTS

| KR | 10-2016-0019597 | 2/2016 |
| KR | 10-2017-0084404 | 7/2017 |

(Continued)

OTHER PUBLICATIONS

Examination Report dated Apr. 3, 2020 from the European Patent Office in corresponding European Patent Application No. 19208758.3.

*Primary Examiner* — James Wu
(74) *Attorney, Agent, or Firm* — F. Chau & Associates, LLC

(57) ABSTRACT

A display device includes a display module and a support plate. The display module includes a display panel and a window disposed on the display panel and including a flexible material. In the display module, a folding region foldable about a folding axis and a plurality of non-folding regions adjacent to sides of the folding region are defined on a plane. In a first edge region of the display module, a first end surface of the display panel and a first end surface of the window are substantially aligned with each other, in a second edge region of the display module, a second end surface of the window extends beyond a second end surface of the display panel.

20 Claims, 13 Drawing Sheets

(56) References Cited

U.S. PATENT DOCUMENTS

| | | | |
|---|---|---|---|
| 2015/0002780 A1* | 1/2015 | Lu | G02F 1/133308 |
| | | | 349/60 |
| 2016/0041679 A1* | 2/2016 | Ahn | H01L 51/0097 |
| | | | 345/173 |
| 2018/0138442 A1 | 5/2018 | Kim | |

FOREIGN PATENT DOCUMENTS

| | | |
|---|---|---|
| KR | 10-2017-0133582 | 12/2017 |
| KR | 10-2018-0014403 | 2/2018 |

* cited by examiner

DISPLAY DEVICE HAVING IMPROVED IMPACT RESISTANCE AND ELECTRONIC DEVICE HAVING THE SAME

CROSS-REFERENCE TO RELATED APPLICATIONS

This U.S. non-provisional patent application claims priority under 35 U.S.C. § 119 to Korean Patent Application No. 10-2018-0141682, filed on Nov. 16, 2018, the disclosure of which is hereby incorporated by reference in its entirety.

TECHNICAL FIELD

Exemplary embodiments of the inventive concept relate to a display device and an electronic device having the same, and more particularly, to a foldable display device and an electronic device having the foldable display device.

DISCUSSION OF THE RELATED ART

Electronic devices such as smartphones, tablets, laptop computers, and smart televisions are being developed. Such electronic devices are provided with display devices for providing information. Electronic devices further have various electronic modules aside from display devices.

Recently, display devices, which are provided with flexible display members and are thereby foldable and rollable, are being developed. Unlike flat panel display devices, the flexible display devices may be folded, rolled, or bent like paper. The flexible display devices having variously changeable shapes are easily carried and may improve convenience of users.

SUMMARY

Exemplary embodiments of the inventive concept provide a display device having improved impact resistance and an electronic device having the display device.

According to an exemplary embodiment, a display device includes a display module including a display panel configured to display an image, a window disposed on the display panel and including a flexible material, and a support plate. A folding region foldable about a folding axis, and a plurality of non-folding regions disposed adjacent to a first side and a second side of the folding region are defined on a plane of the display module. The support plate disposed under the display module. In a first edge region of the display module, a first end surface of the display panel and a first end surface of the window are substantially aligned with each other, in a second edge region of the display module, a second end surface of the window extends beyond a second end surface of the display panel.

In an exemplary embodiment, the display panel comprises a display region and a non-display region, the first end surface of the display panel and the first end surface of the window are located on a first virtual line, the second end surface of the window is located a second virtual line, a distance between the first virtual line and the display region is smaller than a distance between the second virtual line and the display region.

In an exemplary embodiment, the second end surface of the display panel is located on a third virtual line, a distance between the third virtual line and the display region is smaller than the distance between the second virtual line and the display region.

In an exemplary embodiment, the display device further includes a functional layer disposed between the display panel and the window.

In an exemplary embodiment, in the first edge region, a first end surface of the functional layer is located on the first virtual line, and in the second edge region, a second end surface of the functional layer is located on the second virtual line.

In an exemplary embodiment, the display device further includes a first protective film disposed between the display panel and the window, and a second protective film disposed on a rear surface of the display panel.

In an exemplary embodiment, in the first edge region, a first end surface of the first protective film and a first end surface of the second protective film are located on the first virtual line, and in the second edge region, a second end surface of the first protective film and a second end surface of the second protective film are located on the second virtual line.

In an exemplary embodiment, the display module further includes a protruding part protruding from at least one side surface of the display module in the second edge region such that a distance between the outer edge of the display module and the second end surface of the window disposed in the second edge region is less than a distance between the outer edge of the display module and the first end surface of the window disposed in the first edge region.

In an exemplary embodiment, in the second edge region, when viewed in a plan view, the protruding part has a polygonal shape or a semicircular shape.

In an exemplary embodiment, in the second edge region, when viewed in the plan view, the protruding part has a rectangular shape or a trapezoidal shape.

In an exemplary embodiment, the window includes at least one of a plastic or a film material.

In an exemplary embodiment, the support plate is a metal plate having a greater strength than the display module.

In an exemplary embodiment, the support plate includes a first support plate disposed in a first non-folding region adjacent to the first side of the folding region, and a second support plate spaced apart from the first support plate and disposed in a second non-folding region adjacent to the second side of the folding region. The first and second non-folding regions are included in the plurality of non-folding regions.

In an exemplary embodiment, the display device further includes a shock absorbing layer disposed between the display module and the support plate.

In an exemplary embodiment, the display module includes a non-bending region and a bending region extending from the non-bending region. The window is disposed in the non-bending region, the display panel is disposed in the non-bending region and the bending region, and the display panel is bendable in the bending region.

According to an exemplary embodiment, an electronic device includes a display device and a case coupled to the display device. The display device includes a display module including a display panel configured to display an image, a window disposed on the display panel and including a flexible material, and a support plate disposed under the display module. A folding region is foldable about a folding axis, and a plurality of non-folding regions disposed adjacent to a first side and a second side of the folding region are defined on a plane of the display module. The display module includes a protruding part protruding from at least one side surface of the display module such that in a first edge region of the display module, a first end surface of the display panel and a first end surface of the window are substantially aligned with each other, and in a second edge region of the display module, a second end surface of the window extends beyond a second end surface of the display panel.

In an exemplary embodiment, the case includes a side wall configured to define an accommodation space for accommodating the display module, and an accommodation groove, into which the protruding part is inserted, is disposed in the side wall.

In an exemplary embodiment, a distance between the side wall and the first end surface is the same as a distance between the side wall and the second end surface.

In an exemplary embodiment, a distance between the side wall and the first end surface is greater than a distance between the side wall and the second end surface.

In an exemplary embodiment, in the first edge region, a first end surface of the display panel and the first end surface of the window are located on a same virtual line, and in the second edge region, a distance between the outer edge of the display module the second end surface of the window is less than a distance between the outer edge of the display module and a second end surface of the display panel.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
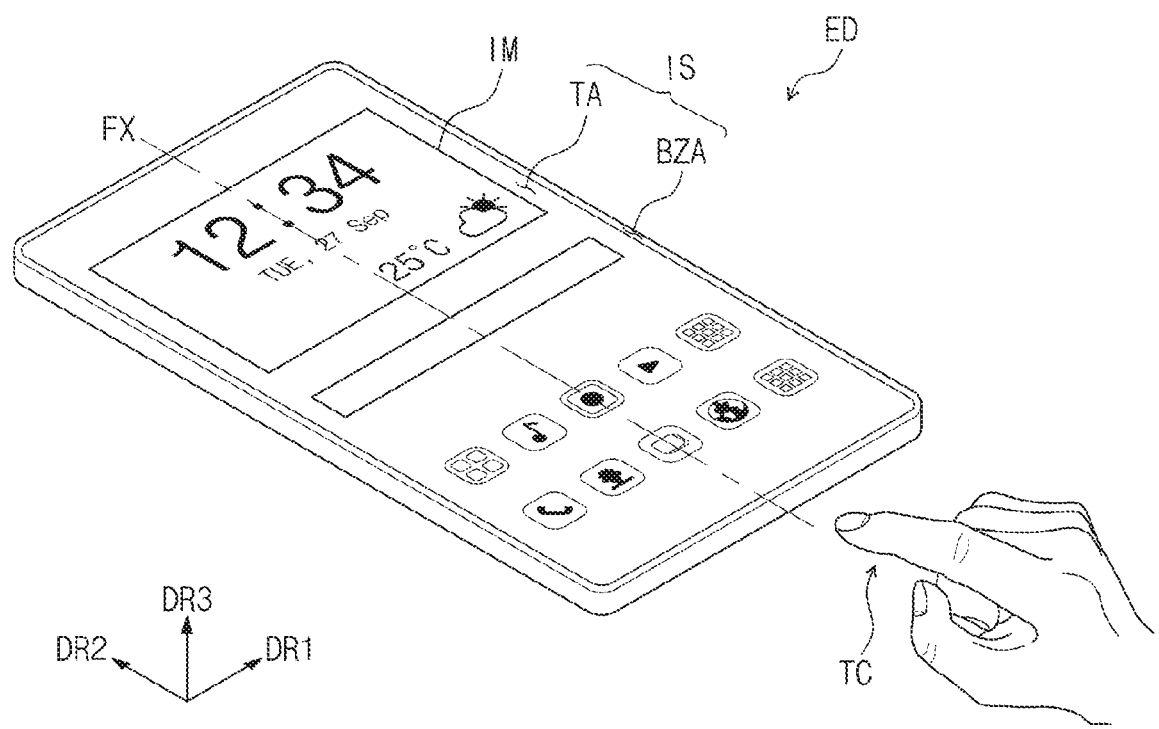
FIG. 1 is a perspective view of an electronic device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that, although the terms first, second, etc. may be used herein to describe various elements, components and/or sections, these elements, components and/or regions should not be limited by these terms. These terms are only used to distinguish one element, component or sections from another region, layer or sections. Thus, a first element, a first component or a first section discussed below could, of course, be termed a second element, a second component, or second section.

Exemplary embodiments will be described with plan views and cross-sectional views as ideal schematic views of the present inventive concept. Accordingly, shapes of the exemplary views may be modified according to manufacturing techniques and/or allowable errors. Therefore, the exemplary embodiments of the present inventive concept are not limited to the specific shapes illustrated in the exemplary views, but may include other shapes that may be created according to manufacturing processes. Thus, areas exemplified in the drawings have general properties, and are used to illustrate specific shapes of element regions.

Figure 2:
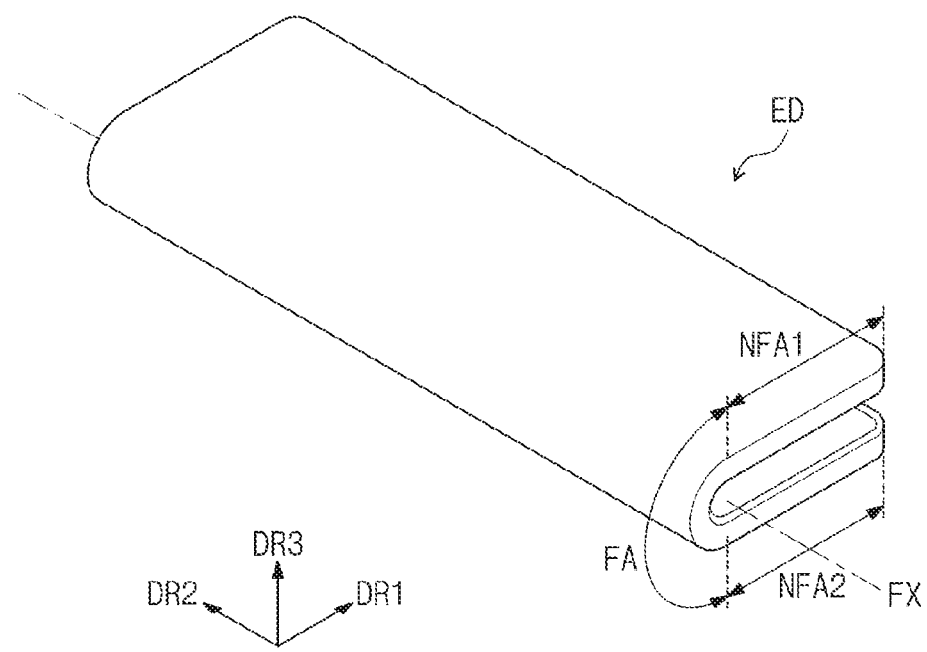
FIG. 2 is a view illustrating a state in which the electronic device illustrated in FIG. 1 is folded.

FIG. 1 is a perspective view of an electronic device according to an exemplary embodiment of the inventive concept. FIG. 2 is a view illustrating a state in which the electronic device illustrated in FIG. 1 is folded.

Referring to FIG. 1, an electronic device ED according to an exemplary embodiment of the inventive concept has a rectangular shape having short sides in a first direction DR1 and long sides in a second direction DR2. The short sides are relatively shorter than the long sides. However, the shape of the electronic device ED is not limited thereto. For example, according to exemplary embodiments, variously shaped electronic devices ED may be provided.

The electronic device ED may be a foldable electronic device. For example, the electronic device ED according to an exemplary embodiment of the inventive concept may be folded with respect to a folding axis FX extending in a predetermined direction. Hereinafter, a state of being folded with respect to the folding axis FX is defined as a folding state, and a state of not being folded is defined as an unfolded state. In an exemplary embodiment of the inventive concept, the folding axis FX may extend in the second direction DR2. However, the extension direction of the folding axis FX is not limited thereto.

The electronic device ED according to exemplary embodiments of the inventive concept may be a large-sized electronic device such as, for example, a television and a monitor, and small and medium-sized electronic devices such as, for example, mobile phones, tablet computers, car navigation devices, and game machines.

As illustrated in FIG. 1, the electronic device ED may display an image IM, in the third direction, on a display surface IS substantially parallel to the first direction DR1 and the second direction DR2. The display surface IS on which the image IM is displayed may correspond to a front surface of the electronic device ED.

The display surface IS of the electronic device ED may include a plurality of regions. The display surface IS of the electronic device ED may be divided into a transmissive region TA and a bezel region BZA. The transmissive region TA may be a region in which the image IM is displayed, and a user views the image through the transmissive region TA. The transmissive region TA may be rectangular. The bezel region BZA may surround the transmissive region TA. Accordingly, the shape of the transmissive region TA may substantially be defined by the bezel region BZA. However, the inventive concept is not limited thereto. For example, according to exemplary embodiments, the bezel region BZA may be disposed adjacent to only one side of the transmissive region TA.

The electronic device ED may include a case. The case is disposed on the outer periphery of the electronic device ED and accommodates components disposed therein. The case will be described in further detail with reference to FIG. 3.

The electronic device ED according to an exemplary embodiment of the inventive concept may detect a user's input TC applied from the outside. The user's input TC includes various types of external inputs such as, for example, a portion of a user's body, light, heat, or pressure. In FIG. 1, the user's input TC is illustrated as the user's hand applied on the front surface of the electronic device ED. However, the inventive concept is not limited thereto. For example, as described above, the user's input TC may be provided in various forms. In exemplary embodiments, the electronic device ED may detect the user's input TC applied to a side surface or the rear surface of the electronic device ED according to the structure of the electronic device ED. For example, the user's input TC may be a squeeze action or a touch action applied by the user on the side surface(s) or the rear surface of the electronic device ED.

The electronic device ED may activate the display surface IS to thereby activate the image IM and detect the external input TC. In FIG. 1, the region which detects the external input TC is illustrated to be provided in the transmissive region TA on which the image IM is displayed. However, the inventive concept is not limited thereto. For example, in exemplary embodiments, the region which detects the external input TC may be provided on the bezel region BZA or may be provided on the entirety of the display surface IS.

As illustrated in FIGS. 1 and 2, the electronic device ED according to an exemplary embodiment of the inventive concept may be folded with respect to the folding axis FX. The folding axis FX may also be referred to as a virtual folding axis FX. The electronic device ED may be divided into a plurality of regions according to the folding. For example, the electronic device ED may be divided into a folding region FA and one or more non-folding regions NFA1 and NFA2. The folding region FA is defined between the two non-folding regions NFA1 and NFA2. The folding region FA is a region which may be bent according to a folding operation, and is a region to which folding stress is applied. For example, the folding region FA is foldable about the folding axis FX. For example, the folding region FA may be folded about the folding axis FX and unfolded about the folding axis FX.

In an exemplary embodiment of the inventive concept, the non-folding regions NFA1 and NFA2 may include a first non-folding region NFA1 and a second non-folding region NFA2. The first non-folding region NFA1 is adjacent to one side of the folding region FA in the first direction DR1, and the second non-folding region NFA2 is adjacent to the other side of the folding region FA in the first direction DR1.

The electronic device ED may be subjected to in-folding or out-folding. In-folding refers to folding in which the display surface IS is folded so as to have portions facing each other, and out-folding refers to folding in which the rear surface of the electronic device ED is folded so as to face have portions facing each other. When subjected to in-folding, the display surface IS of the electronic device ED may be protected from the outside. When subjected to out-folding, the display surface IS of the electronic device ED may be exposed to the outside. FIG. 2 illustrates a state in which an electronic device ED according to an exemplary embodiment of the inventive concept is subjected to in-folding.

In FIG. 1, one folding region FA is defined in one electronic device ED. However, the inventive concept is not limited thereto. For example, according to an exemplary embodiment of the inventive concept, a plurality of folding regions may be defined.

Figure 3:
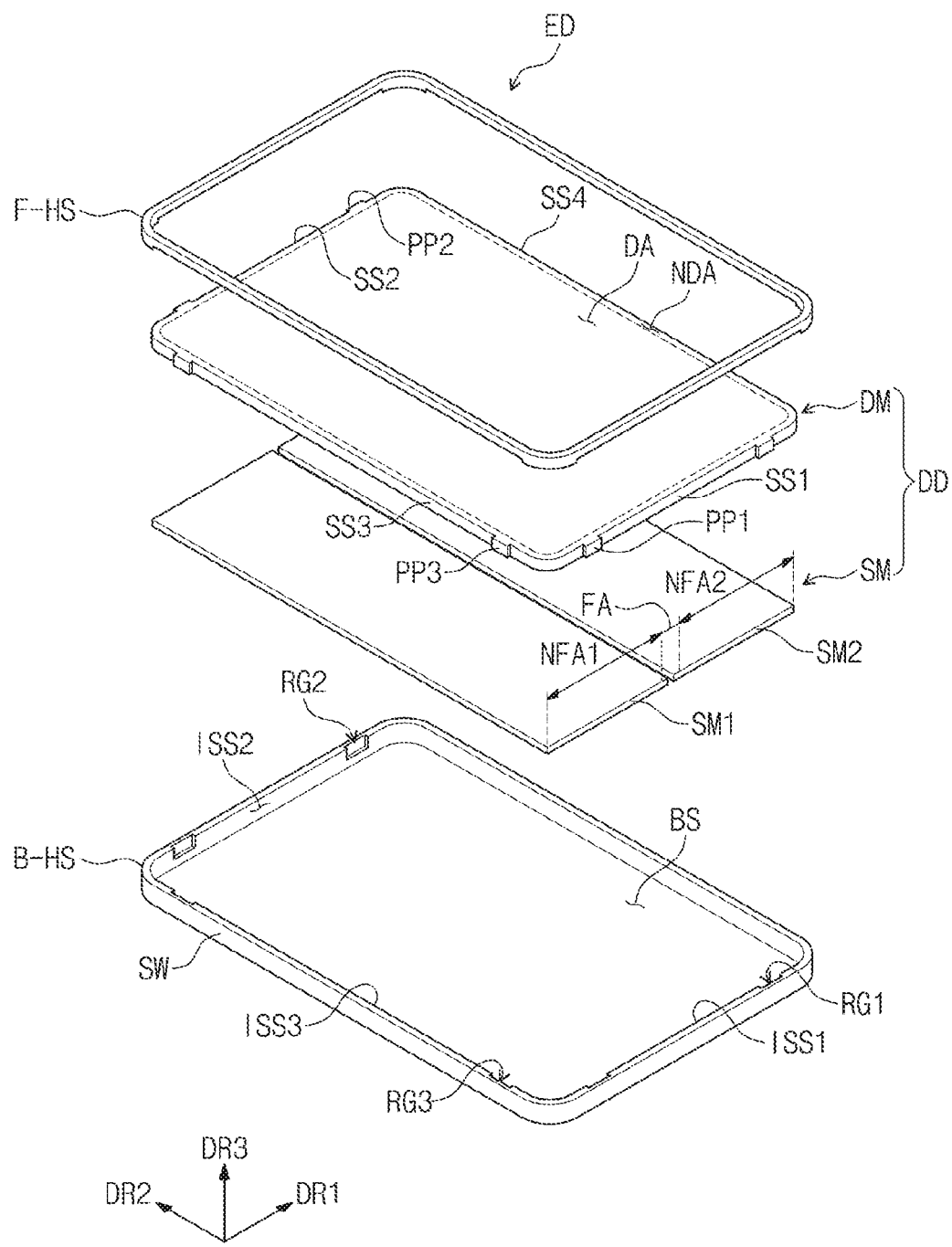
FIG. 3 is an exploded perspective view of the electronic device illustrated in FIG. 1.

FIG. 3 is an exploded perspective view illustrating the electronic device illustrated in FIG. 1.

Referring to FIG. 3, the electronic device ED may include a display device DD. In FIG. 3, for convenience of illustration, some of the above-described components may be omitted or simply illustrated.

The display device DD includes a display module DM and a support plate SM. The display module DM may include a display panel which displays an image and a window disposed on the display panel. The display module DM may include a display region DA and a non-display region NDA. The display region DA is a region in which an image is displayed, and may be a region corresponding to the transmissive region TA (shown in FIG. 1) of the electronic device ED. The non-display region NDA may be a region covered by the bezel region BZA (shown in FIG. 1) of the electronic device ED, and in which an image is not displayed. In the non-display region NDA, components used for driving the display region DA may be disposed. For example, a drive circuit, drive wiring, a pad, etc. may be disposed in the non-display region NDA.

On a plane, a folding region FA which is folded about a folding axis FX, and first and second non-folding regions NFA1 and NFA2 which are adjacent to both sides of the folding region FA, may be defined in the display module DM. For example, the first non-folding region NFA1 may be disposed adjacent to a first side of the folding region FA, and the second non-folding region NFA2 may be disposed adjacent to a second side of the folding region FA. The first and second sides of the folding region FA may be long sides of the folding region FA (e.g., relative to other sides of the folding region FA). However, the inventive concept is not limited thereto. The folding region FA and the first and second non-folding regions NFA1 and NFA2 may be defined on a plane of the display module DM. The folding region FA and the first and second non-folding regions NFA1 and NFA2 which are defined in the display module DM respectively correspond to the folding region FA and the first and second non-folding regions NFA1 and NFA2 which are illustrated in FIG. 1. Thus, the same reference numerals are used.

The support plate SM is disposed under the display module DM. The support plate SM may include a first support plate SM1 and a second support plate SM2. The first support plate SM1 supports the first non-folding region NFA1 of the display module DM and the second support plate SM2 supports the second non-folding region NFA2 of the display module DM.

The first and second support plates SM1 and SM2 have plate shapes. In an exemplary embodiment, the first and second support plates SM1 and SM2 may each have a rectangular shape. However, the shape of the first and second support plates SM1 and SM2 is not limited thereto. In an exemplary embodiment, the size of the first and second support plates SM1 and SM2 may together correspond to the size of the display module DM. The strengths of the first and second support plates SM1 and SM2 may be larger than the strength of the display module DM. For example, the first and second support plates SM1 and SM2 may include a metal material. However, the material for the first and second support plates SM1 and SM2 is not limited thereto. For example, the first and second support plates SM1 and SM2 may be more rigid than the display module, and thus, may be less susceptible to physical damage.

The first and second support plates SM1 and SM2 are spaced apart from each other in the first direction DR1. The first and second support plates SM1 and SM2 may be spaced apart corresponding to the folding region FA. The first support plate SM1 may partially overlap the folding region FA, and the second support plate SM2 may partially overlap the folding region FA.

The electronic device ED may include a case which covers the display device DD. The case may include a rear case B-HS and a front case F-HS. However, the inventive concept is not limited thereto. In an exemplary embodiment, the electronic device ED may include only the rear case B-HS and the front case F-HS may be omitted.

The rear case B-HS may include a bottom surface BS and a side wall SW extending from the bottom surface BS, and the support plate SM and the display module DM may be accommodated in an inner space defined by the bottom surface BS and the side wall SW. In addition, other components constituting the electronic device ED may be accommodated in the rear case B-HS.

The rear case B-HS may include a material having relatively high stiffness. For example, the rear case B-HS may include a plurality of frames and/or plates composed of glass, plastic, or metal. The rear case B-HS may safely protect the components of the electronic device ED accommodated in the inner space.

As illustrated in FIG. 3, the display module DM according to an exemplary embodiment of the inventive concept includes a protruding part protruding from at least one side surface of the display module DM. The display module DM may include first and second side surfaces SS1 and SS2 extending in the first direction DR1, and third and fourth side surfaces SS3 and SS4 extending in the second direction DR2. The protruding part may protrude from at least one side surface among the first to fourth side surfaces SS1 to SS4. In FIG. 3, a structure in which the protruding part protrudes from the first to third side surfaces SS1 to SS3 is illustrated. However, the inventive concept is not limited thereto. For example, according to exemplary embodiments, the protruding part may protrude from two side surfaces among the first to fourth side surface s SS1 to SS4, or from all of the four side surfaces SS1 to SS4.

For example, the protruding part may include a first protruding part PP1 protruding from the first side surface SS1, a second protruding part PP2 protruding from the second side surface SS2, and a third protruding part PP3 protruding from the third side surface SS3. Each of the first to third side surfaces PP1 to PP3 may be composed of one or more protrusions. For example, each of the first to third side surfaces PP1 to PP3 may include one or more protruding parts. In FIG. 3, a structure in which each of the first to third side surfaces PP1 to PP3 includes two protruding parts is illustrated. However, the inventive concept is not limited thereto.

The rear case B-HS may further include accommodation grooves disposed in the inner side surfaces of the side wall SW corresponding to the protruding parts. For example, the accommodation groove may include a first accommodation groove RG1, a second accommodation groove RG2, and a third accommodation groove RG3. The first to third accommodation grooves RG1 to RG3 are respectively disposed in first, second and third side surfaces ISS1, ISS2 and ISS3. For example, the first accommodation groove RG1 is located at a position corresponding to the first protruding part PP1, the second accommodation groove RG2 is located at a position corresponding to the second protruding part PP2, and the third accommodation groove RG3 is located at a position corresponding to the third protruding part PP3.

The support plate SM is attached to the rear surface of the display module DM through an adhesive film or the like, and thus, assembly of the display device DD may be completed. In the process of assembling the electronic device ED, the display device DD is accommodated in the inner space of the rear case B-HS. At this point, the first to third protruding parts PP1 to PP3 may respectively be accommodated into the first to third accommodation grooves RG1 to RG3.

The front case F-HS may have a frame shape. For example, the front case F-HS may include a border and an open portion disposed within the border. The upper surface of the front case F-HS may cover a portion of the display device DD. For example, the upper surface of the front case F-HS may cover the non-display region NDA of the display device DD. The upper surface of the front case F-HS may define the bezel region BZA of the electronic device ED. The front case F-HS may be composed of, for example, glass, plastic, metal, a resin film etc.

Figure 4:
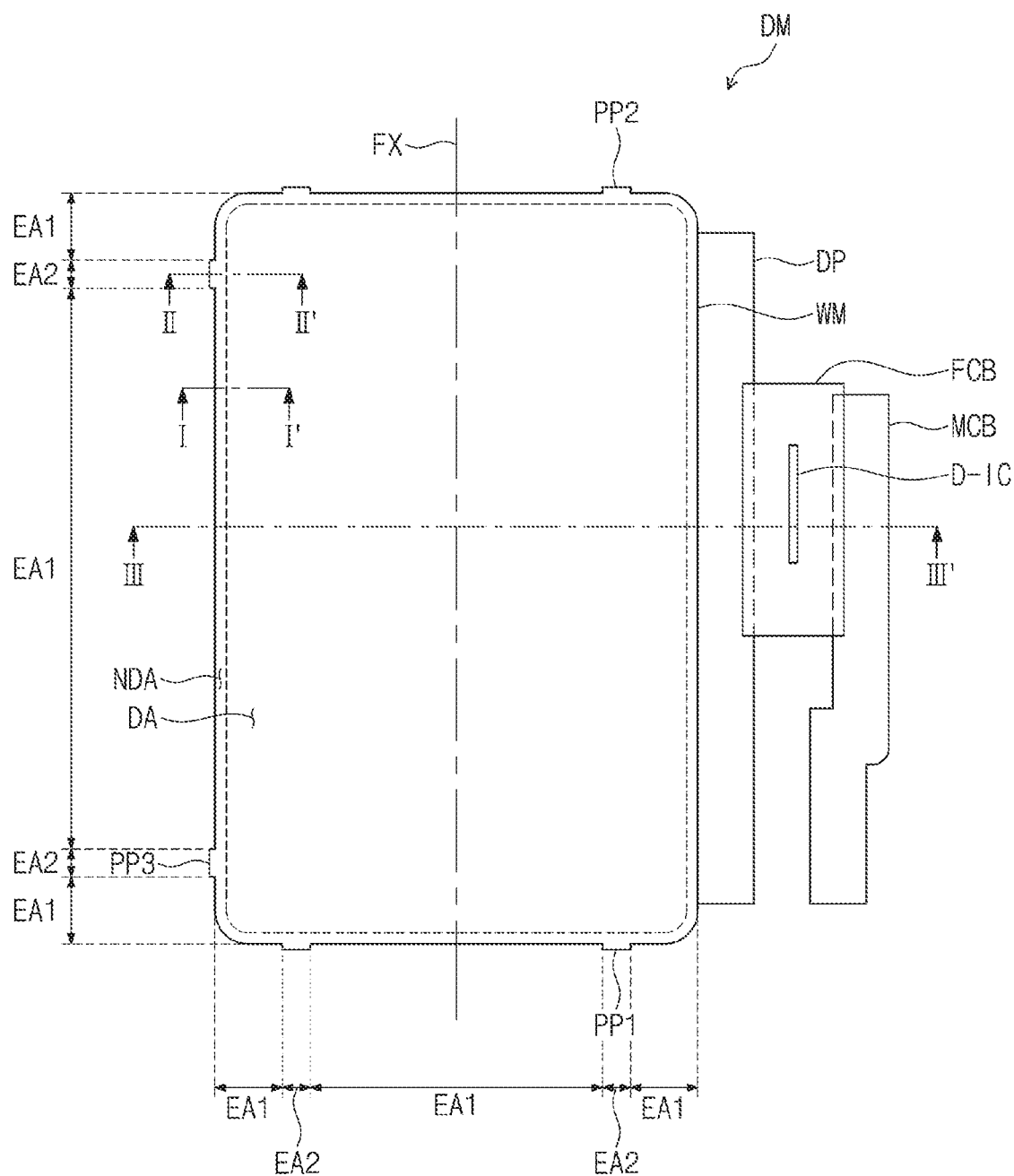
FIG. 4 is a plan view of the display module illustrated in FIG. 3.
Figure 5A:
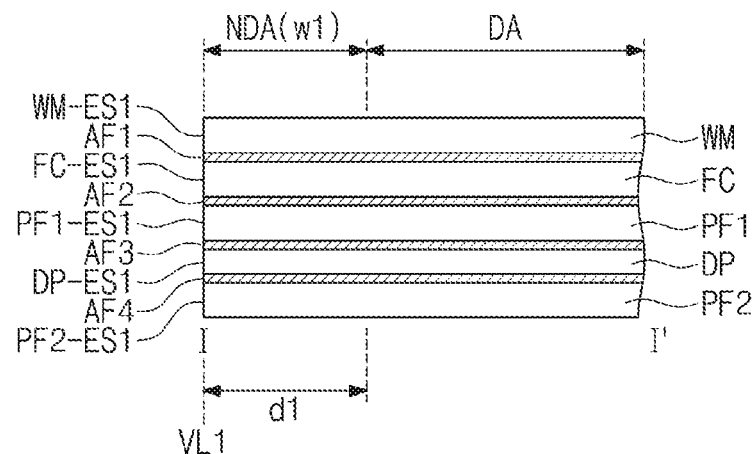
FIG. 5A is a cross-sectional view taken along line I-I' of FIG. 4.
Figure 5B:
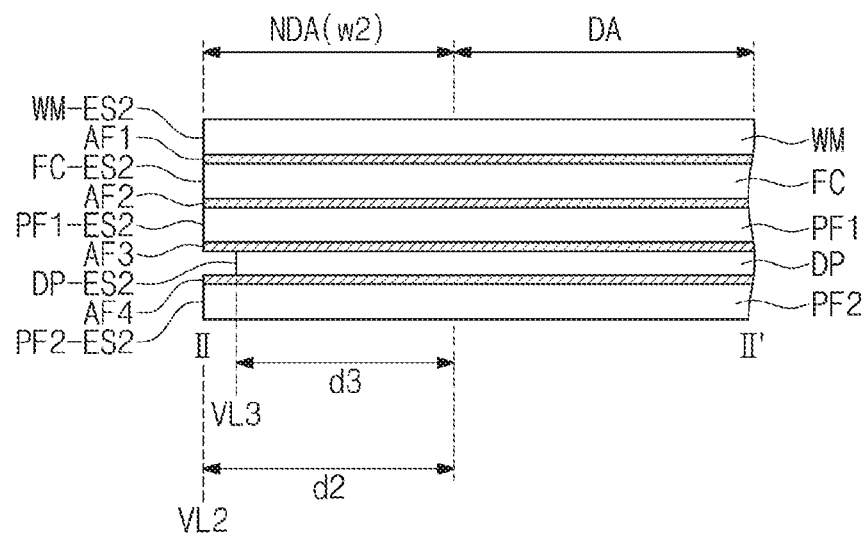
FIG. 5B is a cross-sectional view taken along line II-II' of FIG. 4.

FIG. 4 is a plan view of the display module illustrated in FIG. 3. FIG. 5A is a cross-sectional view taken along line I-I' illustrated in FIG. 4. FIG. 5B is a cross-sectional view taken along line II-II' illustrated in FIG. 4.

Referring to FIGS. 4 and 5A, a display module DM may include a display panel DP which displays an image, and a window WM disposed on the display panel DP.

The display panel DP may be a flexible display panel. Accordingly, the display panel DP may be folded or unfolded about a folding axis FX. In an exemplary embodiment of the inventive concept, the display panel DP may be, for example, an organic light-emitting display panel. However, the display panel DP is not limited thereto.

In an exemplary embodiment of the inventive concept, the display module DM may further include an input detection unit which detects an external input. The input detection unit may have a panel shape and be disposed on the display panel DP. In an exemplary embodiment, the input detection unit may be integrated with the display panel DP through at least one continuous process. That is, the input detection unit may be disposed directly on a thin film encapsulation layer of the display panel DP. Here, the term "directly disposed" means that the input detection unit is disposed on the display panel DP without a separate adhesive member.

The upper surface of a window WM defines a display surface IS (see FIG. 1) of the electronic device ED. The window WM may be optically transparent. Accordingly, an image generated in the display panel DP may pass through the window WM and be easily recognized by a user.

The window WM may be made of a flexible material. Accordingly, the window WM may be folded or unfolded about the folding axis FX. For example, the window WM may be made of a plastic plate or a resin film including an organic material. That is, the window WM may include at least one of a plastic or a film material. However, the window WM is not limited thereto.

One or more functional layers FC may be disposed between the display panel DP and the window WM. In an exemplary embodiment of the inventive concept, the functional layer FC may be a reflection prevention layer which blocks reflection of external light. The reflection prevention layer may prevent a problem in which elements constituting the display panel DP are viewed from the outside due to external light incident through the front surface of the electronic device ED. The reflection prevention layer may include a polarization film and/or a phase delay film. According to an operation principle of the reflection prevention film, the number of the phase delay films and the phase delay length ($\lambda/4$ or $\lambda/2$) may be determined. The window WM and the functional layer FC may be adhered to each other through a first adhesive film AF1.

A first protective film PF1 may be disposed between the functional layer FC and the display panel DP, and a second protective film PF2 may be disposed on the rear surface of the display panel DP. The first protective film PF1 may include a polymer material. The first protective film PF1 may be a layer which absorbs shocks applied from the outside to thereby protect the display panel DP from the shocks. The first protective film PF1 may be adhered to the functional layer FC through a second adhesive film AF2, and may be adhered to the upper surface of the display panel DP through a third adhesive film AF3.

FIG. 5A illustrates that the first protective film PF1 is located between the functional layer FC and the display panel DP. However, the inventive concept is not limited thereto. For example, in exemplary embodiments, the first protective film PF1 may be disposed between the window WM and the functional layer FC, or may be omitted.

The second protective film PF2 may include a polymer material. The second protective film PF2 may be composed of the same material as the first protective film PF1. The second protective film PF2 may be adhered to the rear surface of the display panel DP through a fourth adhesive film AF4.

The first to fourth adhesive films AF1 to AF4 may be optically transparent. The first to fourth adhesive films AF1 to AF4 may each be an adhesive layer manufactured such that a liquid adhesive material is applied and cured, or an adhesive sheet separately manufactured. For example, the first to fourth adhesive films AF1 to AF4 may each be a pressure sensitive adhesive (PSA), an optical clear adhesive (OCA), or an optical clear resin (OCR).

Referring to FIGS. 4, 5A and 5B, the display module DM may be divided into a display region DA and a non-display region NDA.

The non-display region NDA of the display module DM has a first width w1 in a first edge region EA1, and has a second width w2 in a second edge region EA2. The second width w2 is larger than the first width w1.

In the first edge region EA1, a first end surface DP-ES1 (hereinafter referred to as a first panel end surface) of the display panel DP and a first end surface WM-ES1 (hereinafter referred to as a first window end surface) of the window WM are located on the same line. For example, the first panel end surface DP-ES1 and the first window end surface WM-ES1 may be located on a first virtual line VL1. The first virtual line VL1 may be a normal line orthogonal to the rear surface of the display module DM. However, the inventive concept is not limited thereto. For example, in an exemplary embodiment, the first virtual line VL1 may be an inclined line inclined a predetermined angle with respect to the normal line. In an exemplary embodiment, the first panel end surface DP-ES1 and the first window end surface WM-ES1 may be substantially aligned with each other in the second direction DR2 (e.g., at the first virtual line VL1). Herein, the terms virtual line and imaginary line may be used interchangeably.

Herein, when two or more components are described as being substantially aligned with each other, it is to be understood that the two or more components are exactly aligned with each other, or are almost aligned with each other within a measurement error as would be understood by a person having ordinary skill in the art.

As illustrated in FIG. 5A, in the first edge region EA1, a first end surface FC-ES1 of the functional layer FC and first end surfaces PF1-ES1 and PF2-ES1 of the first and second protective films PF1 and PF2 may be located on the same line as the first window end surface WM-ES1 and the first panel end surface DP-ES1. That is, the first end surface FC-ES1 of the functional layer FC and the first end surfaces PF1-ES1 and PF2-ES1 of the first and second protective films PF1 and PF2 may be located on the first virtual line VL1. In an exemplary embodiment, the first end surface FC-ES1 of the functional layer FC and the first end surfaces PF1-ES1 and PF2-ES1 of the first and second protective films PF1 and PF2 may be substantially aligned with each other in the second direction DR2 (e.g., at the first virtual line VL1).

Referring to FIG. 5B, in the second edge region EA2, a second end surface DP-ES2 (hereinafter, referred to as a second panel end surface) of the display panel DP and a second end surface WM-ES2 (hereinafter referred to as a second window end surface) of the window WM are not located on the same line. For example, in the second edge region EA2, the second panel end surface DP-ES2 and the second window end surface WM-ES2 are not substantially aligned with each other in the second direction DR2. For example, in the second edge region EA2, the second window end surface WM-ES2 may extend beyond the second panel end surface DP-ES2. For example, the second end surface WM-ES2 may be located on a second virtual line VL2, and the second panel end surface DP-ES2 may be located on a third virtual line VL3 spaced apart from the second virtual line VL2 in the first direction DR1. In an exemplary embodiment of the inventive concept, the third virtual line VL3 is disposed further adjacent to the display region DA than the second virtual line VL2. For example, a distance d3 between the third virtual line VL3 and the display region DA may be smaller than a distance d2 between the second virtual line VL2 and the display region DA. That is, in the second edge region EA2, the second window end surface WM-ES2 may be located outside the second panel end surface DP-ES2.

In an exemplary embodiment, among the first, second and third virtual lines VL1, VL2 and VL3, the first virtual line VL1 may be located closest to the display region DA, the second virtual line VL2 may be located furthest from the display region DA, and the third virtual line VL3 may be located between the first and second virtual lines VL1 and VL2. For example, a distance d1 between the display region DA and the first virtual line VL1 may be less than a distance d3 between the display region DA and the third virtual line VL3, and the distance d3 between the display region DA and the third virtual line VL3 may be less than a distance d2 between the display region DA and the second virtual line VL2.

In an exemplary embodiment, as a result of the inclusion of the protruding part protruding from at least one side surface of the display module DM, a distance between the outer edge of the display module DM and the second window end surface WM-ES2 disposed in the second edge region EA2 is less than a distance between the outer edge of the display module DM and the first window end surface WM-ES1 disposed in the first edge region EA1.

The second and third virtual lines VL2 and VL3 may each be a normal line orthogonal to the rear surface of the display module DM. However, the inventive concept is not limited thereto. For example, In an exemplary embodiment, the second virtual line VL2 may be an inclined line inclined a predetermined angle with respect to the normal line.

The first and second virtual lines VL1 and VL2 may be cutting lines of the display module DM. For example, in a work panel in which a plurality of display cells are formed, the display module DM may be formed such that cutting lines are formed for every display cell, and the work panel is cut along the cutting lines. Thus, the end surface (for example, the end surface of the window WM) of the display module DM may be located on the cutting line. In an exemplary embodiment of the inventive concept, the first and second virtual lines VL1 and VL2 may be the cutting lines, and the third virtual line VL3 may be located further inside the display module than the cutting lines.

As illustrated in FIG. 5B, in the second edge region EA2, a second end surface FC-ES2 of the functional layer FC and second end surfaces PF1-ES2 and PF2-ES2 of the first and second protective films PF1 and PF2 may be located on the same line as the second window end surface WM-ES2. For example, in the second edge region EA2, the second end surface FC-ES2 of the functional layer FC and the second end surfaces PF1-ES2 and PF2-ES2 of the first and second protective films PF1 and PF2 may be substantially aligned with each other in the second direction DR2. For example, the second end surface FC-ES2 of the functional layer FC and the second end surfaces PF1-ES2 and PF2-ES2 of the first and second protective films PF1 and PF2 may be located on the second virtual line VL2. That is, in the second edge region EA2, the second end surface FC-ES2 of the functional layer FC and the second end surfaces PF1-ES2 and PF2-ES2 of the first and second protective films PF1 and PF2 may be located outside the second panel end surface DP-ES2.

Thus, the second panel end surface DP-ES2 may be disposed further inside the display module DM than the end surfaces of the members disposed on the respective upper and lower portions of the display panel DP. For example, when the display module DM is assembled to the rear case B-HS, a shock may be applied to the display panel DP when edge regions of the rear case B-HS and the display module DM collide. However, when the second panel end surface DP-ES2 of the display panel DP is disposed further inside the display module DM than the end surfaces of the other members, the second panel end surface DP-ES2 of the display panel DP may be protected by the other members. Thus, elements or wires formed in the display panel DP may be prevented from being damaged by physical impact such as shock, or damage that may occur to elements or wires formed in the display panel DP as the result of physical impact may be reduced.

Figure 6:
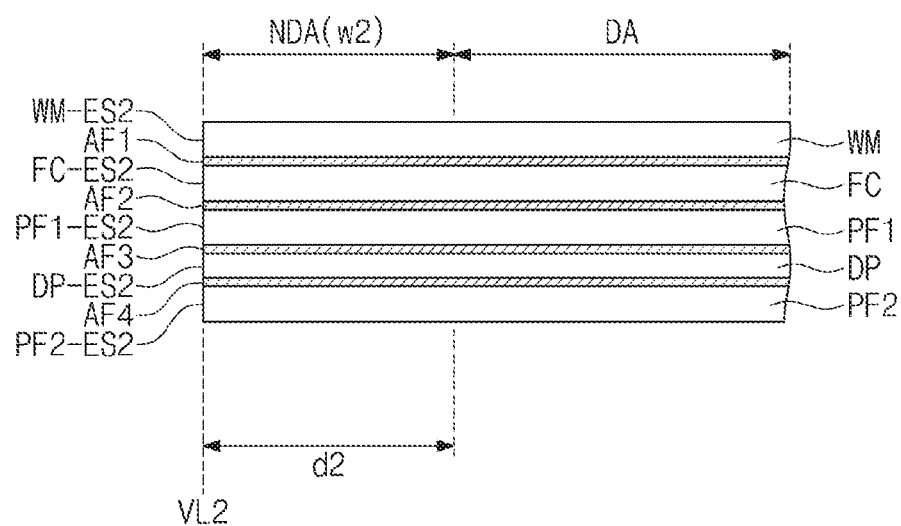
FIG. 6 is a cross-sectional view of a display module according to an embodiment of the inventive concept.

FIG. 6 is a cross-sectional view of a display module according to an exemplary embodiment of the inventive concept.

Referring to FIGS. 5A, 5B, and 6, in the second edge region EA2, a second end surface DP-ES2 (hereinafter, referred to as a second panel end surface) of the display panel DP and a second end surface WM-ES2 (hereinafter referred to as a second window end surface) of the window WM may be located on the same line. For example, the second window end surface WM-ES2 and the second panel end surface DP-ES2 may be located on a second virtual line VL2. For example, the second window end surface WM-ES2 and the second panel end surface DP-ES2 may be substantially aligned with each other.

In an exemplary embodiment of the inventive concept, the second virtual line VL2 may be farther from a display region DA than the first virtual line VL1. When the first virtual line VL1 is located at a first distance d1 in the display region DA, the second virtual line VL2 may be located at a second distance d2 in the display region DA. The second distance is larger than the first distance d1. That is, the second window end surface WM-ES2 and the second panel end surface DP-ES2 may be located outside the first window end surface WM-ES1 and the first panel end surface DP-ES1.

In the second edge region EA2, the second end surface FC-ES2 of the functional layer FC and the second end surfaces PF1-ES2 and PF2-ES2 of the first and second protective films PF1 and PF2 may be located on the same line as the second window end surface WM-ES2 and the second panel end surface DP-ES2. That is, the second end surface FC-ES2 of the functional layer FC and the second end surfaces PF1-ES2 and PF2-ES2 of the first and second protective films PF1 and PF2 may be located on the second virtual line VL2. For example, the second end surface FC-ES2 of the functional layer FC and the second end surfaces PF1-ES2 and PF2-ES2 of the first and second protective films PF1 and PF2 may be substantially aligned with each other on the second virtual line VL2. Accordingly, the second end surface FC-ES2 of the functional layer FC and the second end surfaces PF1-ES2 and PF2-ES2 of the first and second protective films PF1 and PF2 may be located outside the first end surface FC-ES1 of the functional layer FC and the first end surfaces PF1-ES1 and PF2-ES1 of the first and second protective films PF1 and PF2.

Accordingly, the second panel end surface DP-ES2 may be disposed at a position farther from the display region DA than the first panel end surface DP-ES1. For example, when the display module DM is assembled to the rear case B-HS, a shock may be applied to the display panel DP when edge regions of the rear case B-HS and the display module DM collide. However, when a shock is applied from a position far from the display region DA as the position of the second panel end surface DP-ES2 of the display panel DP, the shock may not be transferred to elements or wires formed in the display region DA of the display panel DP. As a result, damage to these elements or wires may be prevented or reduced.

Figure 7:
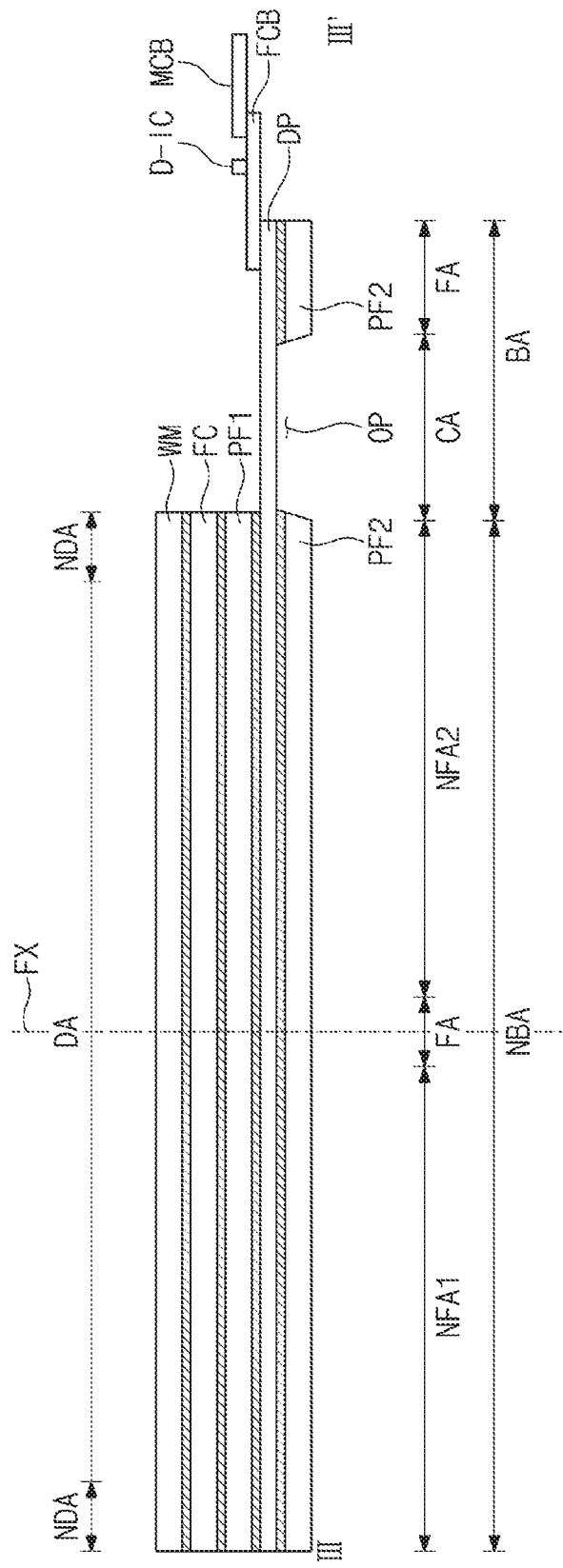
FIG. 7 is a cross-sectional view taken along line III-III' of FIG. 4.
Figure 8:
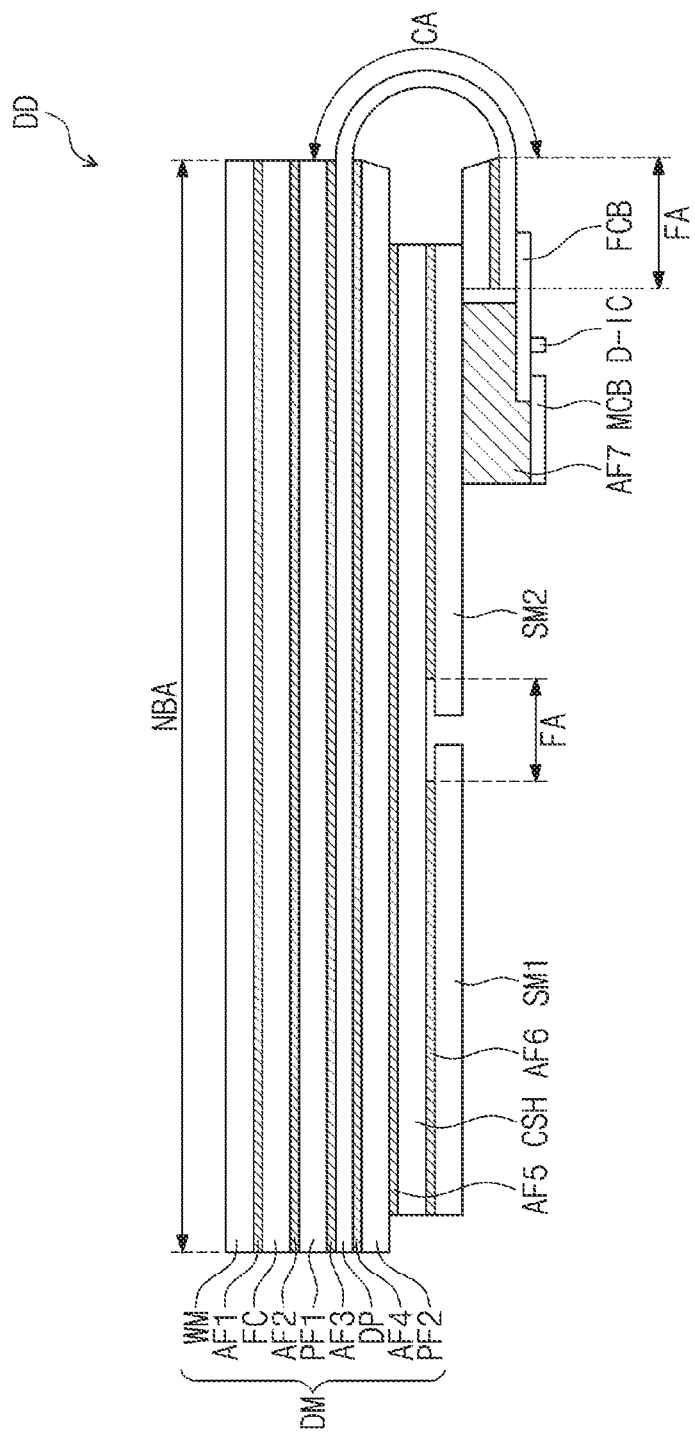
FIG. 8 is a cross-sectional view illustrating a bent structure in which a display module is bent.

FIG. 7 is a cross-sectional view taken along line III-III' of FIG. 4. FIG. 8 is a cross-sectional view illustrating a structure in which a display module is bent. In describing FIGS. 7 and 8, for convenience of explanation, a further description of components and technical aspects previously described may be omitted.

Referring to FIGS. 4 and 7, the display panel DP is a flexible display panel. For example, the display panel DP may be a flexible organic light-emitting display panel. The display panel DP may be divided into a bending region BA and a non-bending region NBA extending from the bending region BA. The non-bending region NBA may be a region including the display region DA and a non-display region NDA of the display module DM, and the bending region BA may be another portion of the display panel DP that is capable of being bent. The folding region FA and the first and second non-folding regions NFA1 and NFA2 may be included in the non-bending region NBA.

In an exemplary embodiment, the window WM is disposed in the non-bending region NBA and is not disposed in the bending region BA. The display panel DP may be disposed in both the non-bending region NBA and the bending region BA, and the display panel DP is bendable in the bending region BA and is not bendable in the non-bending region NBA.

The materials constituting the first and second protective films PF1 and PF2 may not be limited to plastic resins, but rather, may include organic/inorganic composite materials. The first and second protective films PF1 and PF2 may include a porous organic layer and may also include inorganic materials filled in pores in the organic layer. In an exemplary embodiment of the inventive concept, the first and second protective films PF1 and PF2 may be composed of a hydrophilic material.

The display module DM may include a circuit board FCB connected to the display panel DP, and a drive chip D-IC mounted on the circuit board FCB. The circuit board FCB may be connected to a main circuit board MCB. A plurality of passive elements and active elements may be mounted on the main circuit board MCB. The circuit board FCB and the main circuit board MCB may be a flexible circuit board.

In an exemplary embodiment, a chip-on-film (COF) structure in which the drive chip D-IC is mounted on the circuit board FCB may be utilized, as illustrated in FIGS. 4 and 7. However, the inventive concept is not limited thereto. For example, in exemplary embodiments, the display module DM may have a chip-on-panel (COP) structure in which the drive chip D-IC is mounted on the display panel DP (e.g., directly on the display panel DP).

Referring to FIGS. 7 and 8, the bending region BA may include a curvature region CA having a predetermined curvature in a bent state, and a facing region FA that faces the non-bending region NBA in the bent state. The curvature region CA is disposed adjacent to the non-bending region NBA and is a substantially bendable region capable of being bent. The facing region FA is disposed adjacent to the curvature region CA and is a region in which a curvature is not formed. The facing region FA faces the non-bending region NBA and is spaced apart from the non-bending region NBA. The facing region FA is connected with the circuit board FCB.

The second protective film PF2 is disposed in the non-bending region NBA and the facing region FA, and is not disposed in the curvature region CA. An open part OP may be defined in the second protective film PF2 so as to correspond to the curvature region CA. Stress generated in the curvature region CA may be reduced by removing the second protective film PF2 from the curvature region CA. When the open part OP is defined in the second protective film PF2, a fourth adhesive film AF4 may be removed from a location corresponding to the open part OP in an exemplary embodiment of the inventive concept.

In an exemplary embodiment of the inventive concept, the second protective film PF2 may also have a groove defined corresponding to the curvature region CA. That is, the second protective film PF2 may be formed thinner in the curvature region CA than in other regions NBA and FA. For example, in an exemplary embodiment, ends of the second protective film PF2 disposed adjacent to the open part OP may be tapered away from the open part OP.

The display device DD may include support plates SM1 and SM2. When the display module DM has one folding axis FX, the display module DM may include two support plates SM1 and SM2. In exemplary embodiments, when the number of the folding axes FX increases, the number of support plates included in the display module DM may also increase. In this case, the plurality of support plates may be separated with respect to the folding axes.

In an exemplary embodiment of the inventive concept, the first and second support plates SM1 and SM2 support the display panel DP on the rear surface of the second protective film PF2. The first and second support plates SM1 and SM2 may be metal plates having a higher stiffness than the display panel DP. For example, the first and second support plates SM1 and SM2 may be stainless steel plates. The first and second support plates SM1 and SM2 may have a black color so as to block external light incident to the display panel DP.

The display device DD may further include a shock absorbing layer CSH disposed between the first and second support plates SM1 and SM2 and the second protective film PF2. The shock absorbing layer CSH may include a polymer material. The shock absorbing layer CSH may absorb a shock applied from the outside. The shock absorbing layer CSH may have a thickness of about 50 μm to about 250 μm. The shock absorbing layer CSH may have a modulus of about 0.01 MPa to about 500 MPa.

FIGS. 7 and 8 illustrate structures in which the shock absorbing layer CSH is composed of one layer. However, the inventive concept is not limited thereto. For example, in exemplary embodiments, the shock absorbing layer CSH may include a plurality of layers. In addition, the position of the shock absorbing layer is not limited to the position shown in FIG. 8.

The display device DD according to an exemplary embodiment of the inventive concept includes a fifth adhesive film AF5 that attaches the shock absorbing layer CSH to the rear surface of the display module DM, and a sixth adhesive film AF6 that attaches the first and second support plates SM1 and SM2 to the shock absorbing layer CSH. The sixth adhesive film AF6 may be removed from the folding region FA.

When the curvature region CA of the display module DM is bent, the facing region FA faces the non-bending region NBA, and the circuit board FCB connected to the facing region FA and the main circuit board MCB are disposed substantially in parallel to the non-bending region NBA of the display panel DP. A portion of the second support plate SM2 may be disposed between and overlapping the facing region FA and the non-bending region NBA. In addition, after the display module DM is bent, the circuit board FCB and the main circuit board MCB may be mounted on the rear surface of the second support plate SM2.

The display device DD may further include a seventh adhesive film AF7 that attaches the circuit board FCB and the main circuit board MCB to the second support plate SM2. The seventh adhesive film AF7 may further serve, on the rear surface of the second support plate SM2, a height difference compensation function, which compensates a height difference between the circuit board FCB and the main circuit board MCB and a height difference between these components and the display panel DP. Thus, when the seventh adhesive film AF7 serves the height difference compensation function, the circuit board FCB and the main circuit board MCB may be disposed substantially in parallel to the rear surface of the second support plate SM2.

The fifth to seventh adhesive films AF5 to AF7 may be optically transparent. The fifth to seventh adhesive films AF5 to AF7 may each be an adhesive layer manufactured such that a liquid adhesive material is applied and cured, or may be an adhesive sheet separately manufactured. For example, the fifth to seventh adhesive films AF5 to AF7 may each be a pressure sensitive adhesive (PSA), an optical clear adhesive (OCA), or an optical clear resin (OCR).

Figure 9:
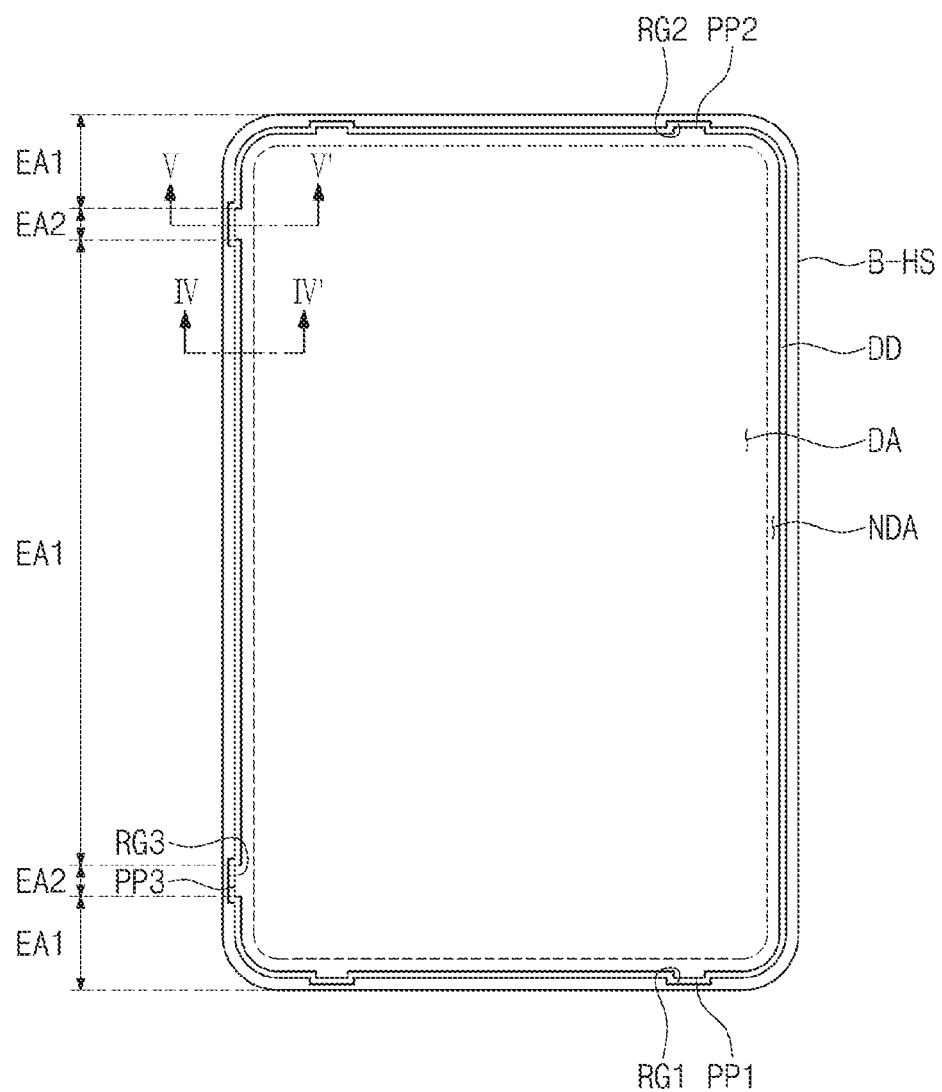
FIG. 9 is a plan view illustrating a state in which the display device illustrated in FIG. 1 and a rear case are assembled.
Figure 10A:
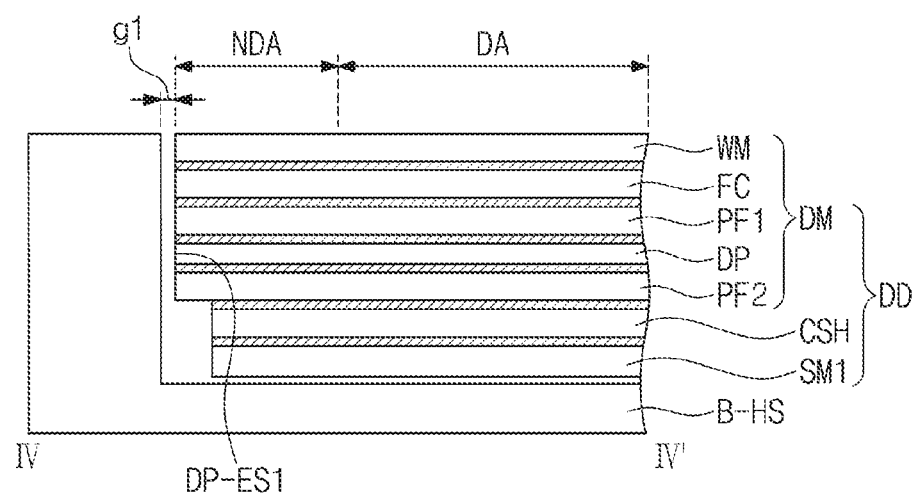
FIG. 10A is a cross-sectional view taken along line IV-IV' of FIG. 9.
Figure 10B:
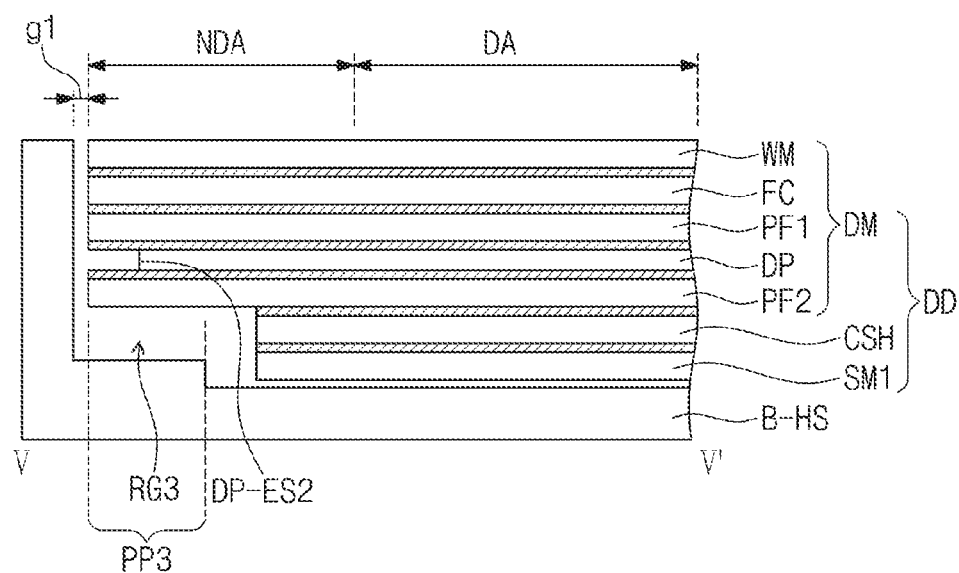
FIG. 10B is a cross-sectional view taken along line V-V' of FIG. 9.

FIG. 9 is a plan view illustrating a state in which the display device illustrated in FIG. 1 is assembled to a rear case. FIG. 10A is a cross-sectional view taken along line IV-IV' of FIG. 9. FIG. 10B is a cross-sectional view taken along line V-V' illustrated in FIG. 9.

Referring to FIGS. 9, 10A and 10B, a display device DD includes a protruding part protruding from at least one side surface of a display module DM. In an exemplary embodiment of the inventive concept, a display device DD includes first to third protruding parts PP1, PP2, and PP3 protruding from first to third side surfaces SS1, SS2 and SS3 (illustrated in FIG. 3) of the display module DM.

A rear case B-HS may further include an accommodation groove corresponding to the protruding parts and disposed in the inner side surfaces of a side wall SW (shown in FIG. 3). For example, the accommodation groove may include a first accommodation groove RG1, a second accommodation groove RG2, and a third accommodation groove RG3. The first to third accommodation grooves RG1 to RG3 are respectively disposed on the first to third side surfaces ISS1, ISS2 and ISS3 (shown in FIG. 3). For example, the first accommodation groove RG1 is located at a position corresponding to the first protruding part PP1, the second accommodation groove RG2 is located at a position corresponding to the second protruding part PP2, and the third accommodation groove RG3 is located at a position corresponding to the third protruding part PP3.

The first to third accommodation grooves RG1 to RG3 are respectively recessed from the first to third side surfaces ISS1 to ISS3. Therefore, the thickness of the side wall SW of the rear case B-HS may decrease by as much as the depth of the first to third accommodation grooves RG1 to RG3 in a region in which the first to third accommodation grooves RG1 to RG3 are formed.

Thus, when the display device DD is assembled to the rear case B-HS, the first to third protruding parts PP1 to PP3 are respectively inserted and accommodated into the first to third accommodation grooves RG1 to RG3.

As illustrated in FIGS. 9, 10A and 10B, a first gap g1 may be formed between the display module DM and the rear case B-HS in the first edge region EA1 in which the first to third protruding parts PP1 to PP3 are not formed. A first gap g1 may be formed between the display module DM and the rear case B-HS in the second edge region EA2 in which the first to third protruding parts PP1 to PP3 are not formed.

As illustrated in FIGS. 10A and 10B, the second panel end surface DP-ES2 may be disposed at a position farther from the display region DA than the first panel end surface DP-ES1. For example, when the display module DM is assembled to the rear case B-HS, a shock may be applied to the display panel DP when edge regions of the rear case B-HS and the display module DM collide. However, when a shock is applied from a position far from the display region DA like the position of the second panel end surface DP-ES2 of the display panel DP, the shock may not be transferred to elements or wires formed in the display region DA of the display panel DP. As a result, damage to the elements or wires may be prevented or reduced.

In addition, the second panel end surface DP-ES2 may be disposed further inside than the end surfaces of the members disposed on the respective upper and lower portions of the display panel DP. As such, when the second panel end surface DP-ES2 of the display panel DP is disposed further inside than the end surfaces of the other members, the second panel end surface DP-ES2 of the display panel DP may be protected by the other members. Thus, elements or wires formed in the display panel DP may be prevented from being damaged by shocks, or damage to the elements or wires may be reduced.

Figure 11:
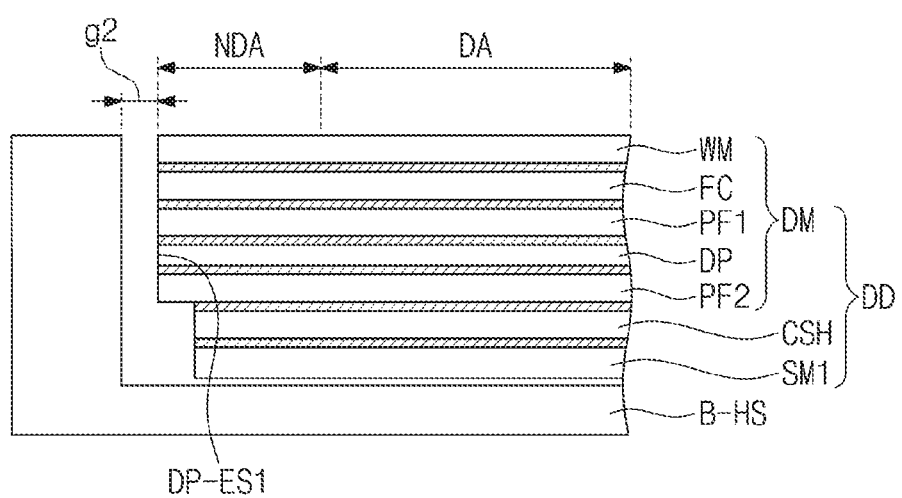
FIG. 11 is a cross-sectional view illustrating a display apparatus and a rear case, which are combined with each other, according to an exemplary embodiment of the inventive concept.

FIG. 11 is a cross-sectional view illustrating a display apparatus and a rear case, which are coupled to each other, according to an exemplary embodiment of the inventive concept.

Referring to FIGS. 9, 10A and 11, a first gap g1 may be formed between the display module DM and the rear case B-HS in the second edge region EA2 in which the first to third protruding parts PP1 to PP3 are formed. The first gap g1 may be smaller than a second gap g2 formed between the display module DM and the rear case B-HS in the first edge region EA1 in which the first to third protruding parts PP1 to PP3 are not formed.

That is, the separation distance between the second panel end surface DP-ES2 and the display region DA in the second edge region EA2 is larger than the separation distance between the first panel end surface DP-ES1 and the display region DA in the first edge region EA1. Since the separation distance between the first panel end surface DP-ES1 and the display region DA is smaller than the separation distance between the second panel end surface DP-ES2 and the display region DA, the phenomenon in which elements or wires are damaged due to shocks occurs more in the first edge region EA1 of the display panel DP than in the second edge region EA2 of the display panel DP. However, when a larger separation distance g2 is utilized, the phenomenon in which elements or wires provided in the display region DA are damaged due to shocks may be prevented or decreased in the first edge region EA1.

In the second edge region EA2 in which the separation distance between the second panel end surface DP-ES2 and the display region DA is large, the first gap g1 between the display module DM and the rear case B-HS may be designed to be small. The first gap g1 may be smaller than the second gap g2.

Thus, in an exemplary embodiment of the inventive concept, the display module DM and the rear case B-HS may have the first gap g1 in the second edge region EA2, and the display module DM and the rear case B-HS may have the second gap g2, which is larger than the first gap g1, in the first edge region EA1.

Figure 12:
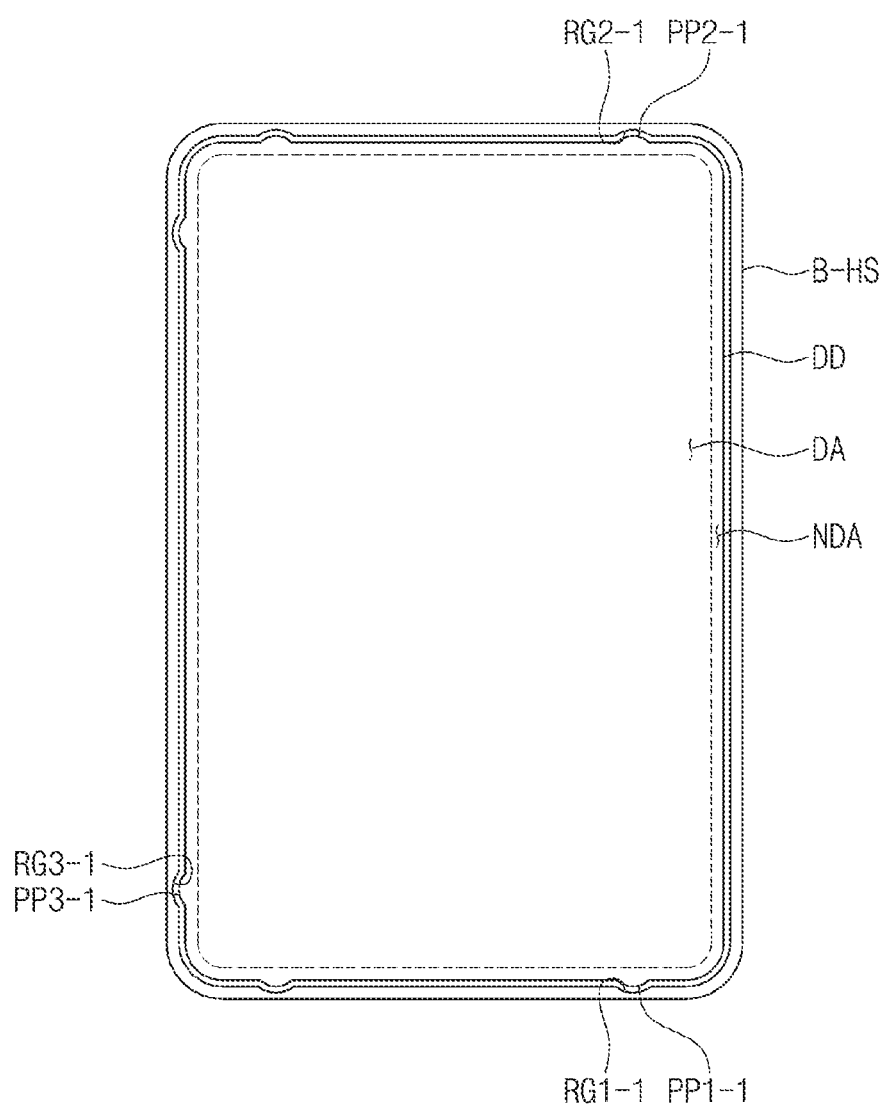
FIG. 12 is a plan view illustrating a state in which a display apparatus and a rear case are assembled according to an exemplary embodiment of the inventive concept.
Figure 13:
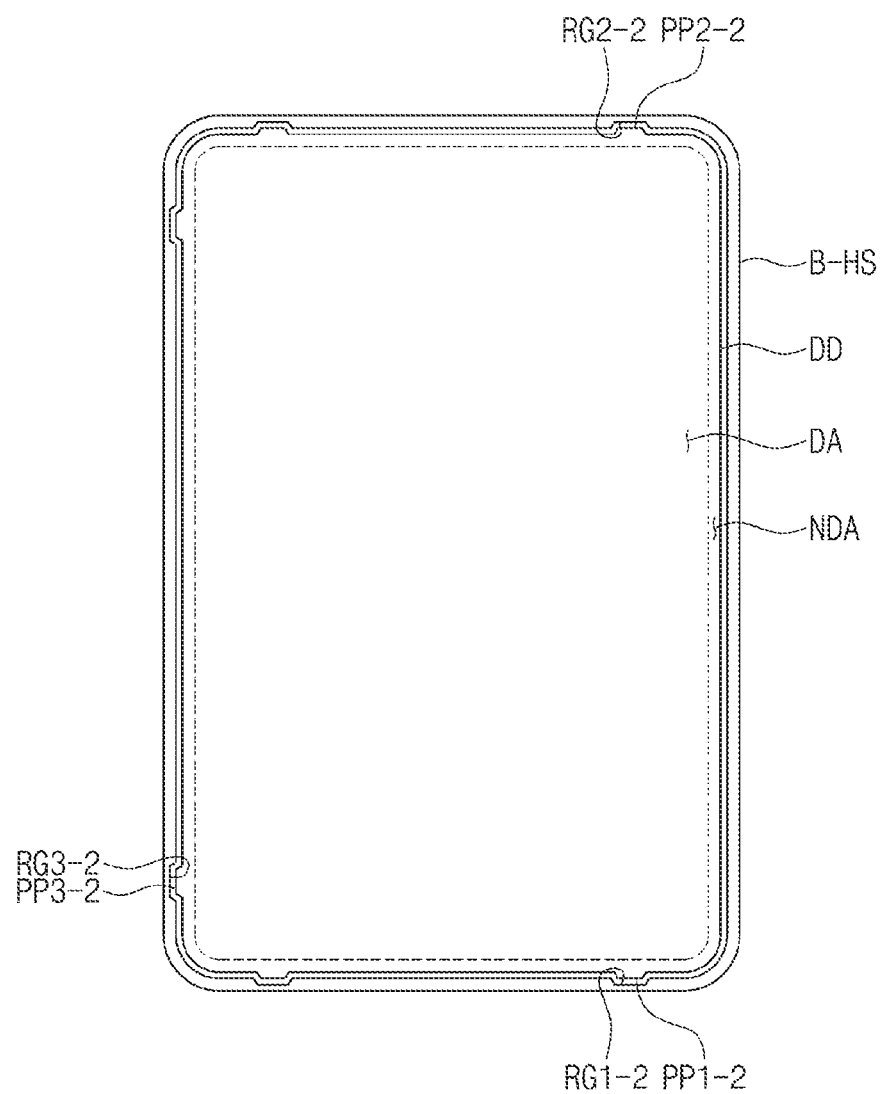
FIG. 13 is a plan view illustrating a state in which a display apparatus and a rear case are assembled according to an exemplary embodiment of the inventive concept.

FIG. 12 is a plan view illustrating a state in which a display device and a rear case are assembled according to an exemplary embodiment of the inventive concept. FIG. 13 is a plan view illustrating a state in which a display device and a rear case are assembled according to an exemplary embodiment of the inventive concept.

Referring to FIG. 12, in a display device DD in an exemplary embodiment of the inventive concept, first to third protruding parts PP1-1, PP2-1 and PP3-1 may have a semicircular shape when viewed in a plan view. For example, instead of an exemplary embodiment in which the protruding parts have a shape including right angles, the first to third protruding parts PP1-1, PP2-1 and PP3-1 may have a semicircular shape having no sharp edges. The shape of the first to third protruding parts PP1-1, PP2-1 and PP3-1 is not limited to the semicircular shape, but rather, may be any rounded shape.

Still referring to FIG. 12, in an exemplary embodiment, the rear case B-HS may further include first to third accommodation grooves RG1-1, RG2-1 and RG3-1 respectively corresponding to the first to third protruding parts PP1-1, PP2-1 and PP3-1. Similar to the first to third protruding parts PP1-1, PP2-1 and PP3-1, the first to third accommodation grooves RG1-1, RG2-1 and RG3-1 may have a semicircular shape when viewed in a plan view. For example, instead of an exemplary embodiment in which the accommodation grooves have a shape including right angles, the first to third accommodation grooves RG1-1, RG2-1 and RG3-1 may have a semicircular shape having no sharp edges. The shape of the first to third accommodation grooves RG1-1, RG2-1 and RG3-1 is not limited to the semicircular shape, but rather, may be any rounded shape corresponding to the first to third protruding parts PP1-1, PP2-1 and PP3-1.

When the display device DD is assembled to the rear case B-HS, physical impact such as a collision, dents, etc. may occur in edge portions. However, when the first to third protruding parts PP1-1 to PP3-1 have a semicircular shape or a shape with a rounded corner which does not have any non-rounded or sharp corners, physical impact such as a collision or dent defects occurring in a corner portion may decrease.

Referring to FIG. 13, in a display device DD according to an exemplary embodiment of the inventive concept, first to third protruding parts PP1-2, PP2-2 and PP3-2 may have a trapezoidal shape when viewed in a plan view. Similarly, the rear case B-HS may include first to third accommodation grooves RG1-2, RG2-2 and RG3-2 respectively corresponding to the first to third protruding parts PP1-2, PP2-2 and PP3-2.

The first to third protruding parts PP1-2 to PP3-2 and the first to third accommodation grooves RG1-2 to RG3-2 may have various additional shapes. For example, the first to third protruding parts PP1-2 to PP3-2 and the first to third accommodation grooves RG1-2 to RG3-2 may be variously formed in a triangular shape, a hexagonal shape, etc.

According to an exemplary embodiment of the inventive concept, in a portion of a display module, an end surface of a display panel may be disposed further inside the display module than end surfaces of other members disposed on and under the display panel. For example, the end surface of the display panel may be disposed further from an end of the display module than end surfaces of other members disposed on and under the display panel. As a result, defects in which wires and elements disposed in a display region of the display panel are damaged by a shock applied to an edge portion of the display panel may be prevented or reduced.

While the inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
a display module comprising a display panel configured to display an image, and a window disposed on the display panel and comprising a flexible material,
wherein a folding region foldable about a folding axis, and a plurality of non-folding regions disposed adjacent to a first side and a second side of the folding region are defined on a plane of the display module; and
a support plate disposed under the display module, wherein
in a first edge region of the display module on a first side surface of the display module, a first end surface of the display panel and a first end surface of the window are substantially aligned with each other,
in a second edge region of the display module on the first side surface of the display module, a second end surface of the window extends beyond a second end surface of the display panel,
wherein the display panel comprises a display region and a non-display region,
wherein the non-display region has a first width in the first edge region, and the non-display region has a second width in the second edge region,
wherein the second width is larger than the first width.

2. The display device of claim 1, wherein
the first end surface of the display panel and the first end surface of the window are located on a first virtual line, the second end surface of the window is located a second virtual line,
a distance between the first virtual line and the display region is smaller than a distance between the second virtual line and the display region.

3. The display device of claim 2, wherein the second end surface of the display panel is located on a third virtual line,
a distance between the third virtual line and the display region is smaller than the distance between the second virtual line and the display region.

4. The display device of claim 2, further comprising:
an anti-reflection layer disposed between the display panel and the window.

5. The display device of claim 4, wherein in the first edge region, a first end surface of the functional layer is located on the first virtual line, and in the second edge region, a second end surface of the functional layer is located on the second virtual line.

6. The display device of claim 2, further comprising:
a first protective film disposed between the display panel and the window; and
a second protective film disposed on a rear surface of the display panel.

7. The display device of claim 6, wherein in the first edge region, a first end surface of the first protective film and a first end surface of the second protective film are located on the first virtual line, and in the second edge region, a second end surface of the first protective film and a second end surface of the second protective film are located on the second virtual line.

8. The display device of claim 1, wherein the display module comprises:
a protruding part protruding from at least one side surface of the display module in the second edge region such that a distance between the second end surface of the window and the display region is greater than a distance between the first end surface of the window and the display region.

9. The display device of claim 8, wherein in the second edge region, when viewed in a plan view, the protruding part has a polygonal shape or a semicircular shape.

10. The display device of claim 9, wherein in the second edge region, when viewed in the plan view, the protruding part has a rectangular shape or a trapezoidal shape.

11. The display device of claim 1, wherein the window comprises at least one of a plastic or a film material.

12. The display device of claim 1, wherein the support plate is a metal plate having a greater strength than the display module.

13. The display device of claim 12, wherein the support plate comprises:
a first sub support plate disposed in a first non-folding region adjacent to the first side of the folding region; and
a second sub support plate spaced apart from the first sub support plate and disposed in a second non-folding region adjacent to the second side of the folding region,
wherein the first and second non-folding regions are included in the plurality of non-folding regions.

14. The display device of claim 1, further comprising:
a shock absorbing layer disposed between the display module and the support plate.

15. The display device of claim 1, wherein the display module comprises a non-bending region and a bending region extending from the non-bending region,
the non-bending region comprises the folding region and the plurality of non-folding regions,
the window is disposed in the non-bending region, the display panel is disposed in the non-bending region and the bending region, and the display panel is bendable in the bending region.

16. An electronic device, comprising:
a display device; and
a case coupled to the display device, wherein the display device comprises:
a display module comprising a display panel configured to display an image, and a window disposed on the display panel and comprising a flexible material,
wherein a folding region foldable about a folding axis, and a plurality of non-folding regions disposed adjacent to a first side and a second side of the folding region are defined on a plane of the display module; and
a support plate disposed under the display module,
wherein the display module comprises a protruding part protruding from a first side surface of the display module such that in a first edge region of the display module on the first side surface of the display module, a first end surface of the display panel and a first end surface of the window are substantially aligned with each other, and in a second edge region of the display module on the first side surface of the display module, a second end surface of the window extends beyond a second end surface of the display panel,
wherein the display panel comprises a display region and a non-display region,
wherein the non-display region has a first width in the first edge region, and the non-display region has a second width in the second edge region,
wherein the second width is larger than the first width.

17. The electronic device of claim 16, wherein the case comprises a side wall configured to define an accommodation space for accommodating the display module, and an accommodation groove, into which the protruding part is inserted, is disposed in the side wall.

18. The electronic device of claim 17, wherein a distance between the side wall and the first end surface of the window is the same as a distance between the side wall and the second end surface of the window.

19. The electronic of claim 17, wherein a distance between the side wall and the first end surface of the window is greater than a distance between the side wall and the second end surface of the window.

20. The electronic of claim 16, wherein
in the first edge region, the first end surface of the display panel and the first end surface of the window are located on a first virtual line, and in the second edge region, the second end surface of the window is located a second virtual line, and
a distance between the first virtual line and the display region is smaller than a distance between the second virtual line and the display region.

* * * * *